(12) United States Patent
Bailey et al.

(10) Patent No.: US 6,550,029 B1
(45) Date of Patent: Apr. 15, 2003

(54) TESTING SYSTEM AND METHODS WITH PROTOCOL PATTERN INJECTION AND EXTERNAL VERIFICATION

(75) Inventors: Brian K. Bailey, Shrewsbury, MA (US); Robert D. Maiorana, Wellesley, MA (US); Douglas Peeke, Shrewsbury, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/415,144

(22) Filed: Oct. 8, 1999

(51) Int. Cl.[7] .................. G01R 31/28; G06F 11/00; G08C 15/00
(52) U.S. Cl. ............ 714/724; 714/712; 714/742; 714/799; 370/245; 370/249
(58) Field of Search ............ 714/724, 738, 714/742, 744, 735, 736, 733, 734, 718, 719, 799, 37, 712, 715, 821; 365/201; 327/141, 105, 163, 147, 153, 154, 106; 711/100; 712/20; 370/245, 241, 248, 249, 250

(56) References Cited

U.S. PATENT DOCUMENTS 5,583,874 A * 12/1996 Smith et al. ............... 714/712
5,964,894 A * 10/1999 Kurihara .................... 714/738
6,188,253 B1 * 2/2001 Gage et al. ................. 327/105
6,347,382 B1 * 2/2002 Nakayama et al. .......... 714/37

OTHER PUBLICATIONS

Light Pulse Fibre Channel Solutions, Emulex, The Fibre Channel Company, http://www.emulex.com/fc/index.html.

Light Pulse Fibre Channel Solutions, LH5000 Digital Fibre Hub Installation Guide, Aug. 1998.

* cited by examiner

Primary Examiner—Emmanuel L. Moise
(74) Attorney, Agent, or Firm—Bromberg & Sunstein LLP

(57) ABSTRACT

A system and method of testing processor boards in which a test path is created by setting switches in distribution hubs and the devices under test. Test signals are sent through the test path and errors in the signals are used to identify faulty boards. The distribution hubs of an embodiment can detect, report and eliminate errors in the test signals. A command path from a host to the distribution hubs and devices under test is provided through a multi-terminal connector. The command path is preferably separate from the test path. A test signal generator may be included. The system may be particularly adapted for fiber channel testing.

37 Claims, 7 Drawing Sheets

TESTING SYSTEM AND METHODS WITH PROTOCOL PATTERN INJECTION AND EXTERNAL VERIFICATION

BACKGROUND OF THE INVENTION

The present invention is directed to a system for testing computer boards, in particular, testing of fibre channel circuitry.

Fibre channel is implemented on a loop and signals are sent on the loop from an initiator node to a target node. The signals move along the loop from one node to the next. Typically, an error in a signal that reaches a target will be noted, if at all, by the target. Identification of where along the loop an error was caused requires special techniques. Stability of fibre channel operation has been improved by the implementation of digital fibre distribution hubs. In particular, the LH5000 Series Digital Fibre Hub manufactured and sold by Emulex Corporation of Costa Mesa, Calif. has the ability to maintain loop integrity by providing automatic bypass of unused and/or non-powered ports. The Emulex hubs eliminate signal jitter, provide automatic clock speed matching on all ports and isolate faulty nodes. An Emulex hub can switch a bypass which isolates faulty nodes and allows the loop to operate normally while cabling or other faults are diagnosed and corrected. The elimination of signal jitter and clock speed and the provision of clock speed matching provides flexibility in network design and cabling distances for fibre channel loops. The Emulex hubs permit system administrators to monitor loop status and look at the number of invalid transmission words, comparative error rates and port down counts.

Manufacturers of computer boards for fibre channel operation including processor boards or host bus adapter boards, benefit from testing their hardware circuitry before shipping it to customers. Components such as fibre channel controllers, serializer/deserializers and drive components have traditionally been tested in an initiator or target. Either one device under test would operate in a loop-back mode or a device under test would communicate with a known good device. In either configuration, the device under test would have to be programmed to perform this diagnostic routine. Access to the appropriate programming interface is often difficult and dictates the overall architecture of the diagnostics. Additionally, the loop-back operation mode lacks an objective source for reporting errors, since the device under test is queried for its own status.

SUMMARY OF THE INVENTION

Embodiments of the present invention are directed to a test system and method for testing devices, such as fibre channel processor boards or host bus adaptors. In accordance with an embodiment of the test system, a test path is formed through at least one distribution hub. Each hub has ports for making connection to ports on devices under test. The ports on the devices can be switched in and out of the test path by controlling switches in the hub. A host computer runs a diagnostic program that sets switches in the distribution hubs and devices under test and causes a test signal to be sent along the test path. By variously adjusting the switches, numerous path configurations may be cycled through to test the various circuitry within the devices under test. In accordance with an embodiment of the invention, the distribution hubs advantageously have the ability to detect, report and eliminate errors in the signals passing there through so that a faulty component can be accurately located and testing can continue along the system. Distribution hubs can be connected in series so that mass testing can take place on numerous devices. This feature is especially advantageous to high volume manufacturing and quality control.

According to a further embodiment of the system and method of the invention, the host computer communicates with the distribution hubs and devices under test through a command path separate from the test path. The command path of the system is provided through a multi-terminal connector, more specifically referred to herein as a terminal concentrator.

In a still further embodiment, a test signal generator is used to send the test signal on the test path. The host communicates with the test signal generator through the multi-terminal connector. The system is particularly advantageous for use with fibre channel testing. As such, the test signal generator would generate a fibre channel protocol signal. According to a further embodiment of the system and method, the test signal is a fibre channel protocol signal not addressed to any device under test. Rather the signal is a loopback signal for returning along the test path back to the test signal generator. For testing dual-ported fibre channel boards, the system includes two test signal generators, one for each of two test loops.

Other objects and advantages of the invention will become apparent during the following description of the presently preferred embodiments of the invention taken in conjunction with the drawings.

DETAILED DESCRIPTION OF THE PREFERRED EMBODIMENTS

Figure 1:
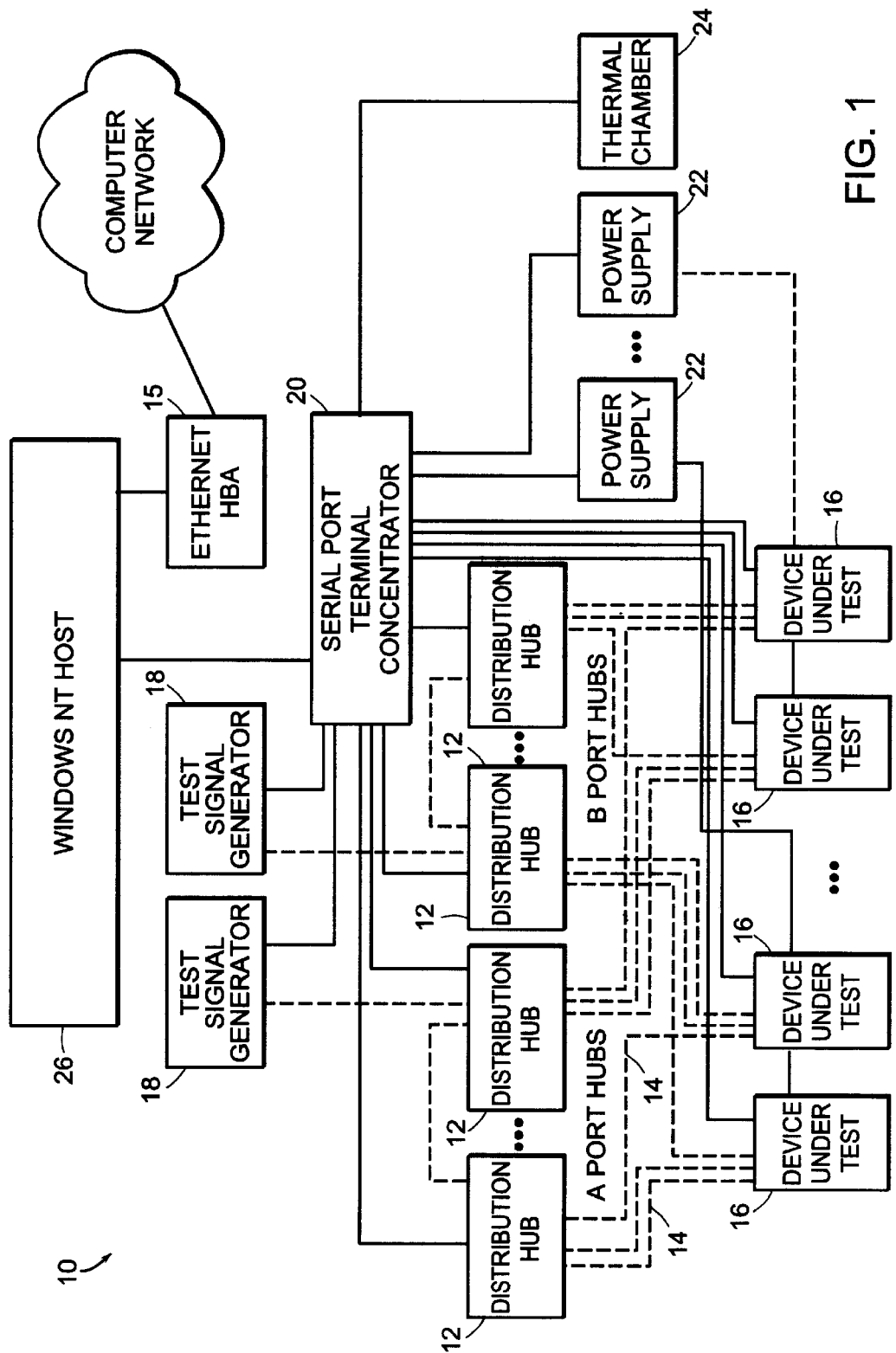
FIG. 1 is a block diagram of an embodiment of the test system of the present invention.

Referring now to FIG. 1, it is seen that a test system 10 of an embodiment of the present invention includes at least one distribution hub 12. A distribution hub 12 has a number of ports 14 for making connection with devices 16 to be tested. A distribution hub includes a number of switches which may include port bypass circuits, for transmitting a signal to one or more selected devices under test 16. The devices under test 16 may be processor boards, host bus adaptors or other computer boards in need of testing.

The system may include a test signal generator 18 for generating a test signal which is to be sent through the at least one distribution hub 12 to each of the devices under test 16 that is being tested in any given test. In an alternative system configuration, a host bus adapter may be employed so that host 26 may itself generate the test signals. A choice of test signals is made which will stress the performance of the circuitry in the devices under test 16. One such test signal would result in a string of consecutive 1's or 0's. Other arrangements of bits in a test signal as is known in the art of quality control may be used as well within the scope of the present invention. The test signal generator is in series with the hub so that it can inject test signals into at least one distribution hub 12. A second test signal generator 18 may also be included in the test system. This is particularly helpful in a fibre channel test system in which the devices under test are dual ported. The second test signal generator 18 provides added flexibility to the testing arrangements for testing all the various ports of each device.

The test system further includes a mechanism for communicating with and controlling the distribution hubs 12, the devices under test 16 and the test signal generator 18. A software application running on a host computer 26 addresses these devices through a multi-terminal connector, such as a terminal concentrator 20. Terminal concentrators are well known in the art. They include many RS232 port connections for making connection to each distribution hub and each device under test. Through these connections, the switches in the distribution hubs and in the devices under test are controlled to be set in any of the allowable positions. Through the terminal concentrator, the application has the ability to monitor the status of the distribution hubs 12, devices under test 16 and signal generator 18. In accordance with a presently preferred embodiment, RocketPort® multiport serial cards are used to form the terminal concentrator. RocketPort® cards are made by Comtrol of St. Paul, Minn.

Power supplies 22 supporting the test system may be conveniently controlled through the terminal concentrator 20 by the application running on the host 26. The application can perform tests on the devices under test with different voltages applied. This testing process is known in the art as margining. A presently preferred power supply is the Xantrex XHR Series 600 watt (at 7.5 volts).

The test system may be advantageously provided with a thermal chamber 24. The thermal chamber 24 is a physical enclosure, similar to a refrigerator, that has both heating and cooling capabilities. The temperature of the chamber can be "margined" during testing similar to the power supply variations. It is only necessary that the devices under test be within the test chamber 24. Preferably, the tester equipment is outside of the chamber because prolonged environmental testing would reduce the life of the electronic components. In accordance with a presently preferred embodiment, the devices under test 16 plug into a backplane, both of which are housed within the thermal chamber 24. The software application in host computer 26 can be given the ability to set the temperature in the thermal chamber 24 via the terminal concentrator 20.

The host computer 26 is used to run a diagnostic program for testing the various circuitry in the devices under test 16. The host 26 performs diagnostic tests on the devices under test 16. The host causes test signals to be generated by a signal generator 18 and directs those signals through a test path determined by switches in the distribution hubs 12 and the devices under test 16. The host communicates along a command path via the terminal concentrator to set the switches to create the desired test path. The host computer 26 communicates with each of the devices under test through the terminal concentrator 20. Thus, the command path is separate from the test path. Errors may be reported to the host 26 over the command path by the distribution hubs, by the devices under test 16 or by the signal generator 18. The concentrator 20 connects to the host 26 in any number of ways, for example, via a USB (Universal Serial Bus) connection, via an Ethernet connection, or by plug in PCI or ISA cards. The RocketPort® terminal concentrator connects directly to the host computer with three 16 port PCI cards. This connection permits the host to communicate with the devices under test, distribution hubs, signal generators, power supplies, and the temperature chamber or gauge. The host 26 determines when the devices under test 16 have completed their self contained (embedded) power-up diagnostic procedures. It then initiates commands to the devices under test to perform additional testing, and to set the switch positions for the following loop diagnostics. Also through the terminal concentrator, the host will set the switches and clear the current status in the distribution hub. Power margining is done by the host through the terminal concentrator by communicating with the power supplies, and also by controlling an internal supply in the device under test. In accordance with a presently preferred embodiment, the host computer 26 is compatible for use with the Windows NT operating system. This computer, and the diagnostic log files created by the tester application are available on a company wide network if the computer 26 is connected to the network via an Ethernet host bus adapter (HBA) 15.

Figure 2:
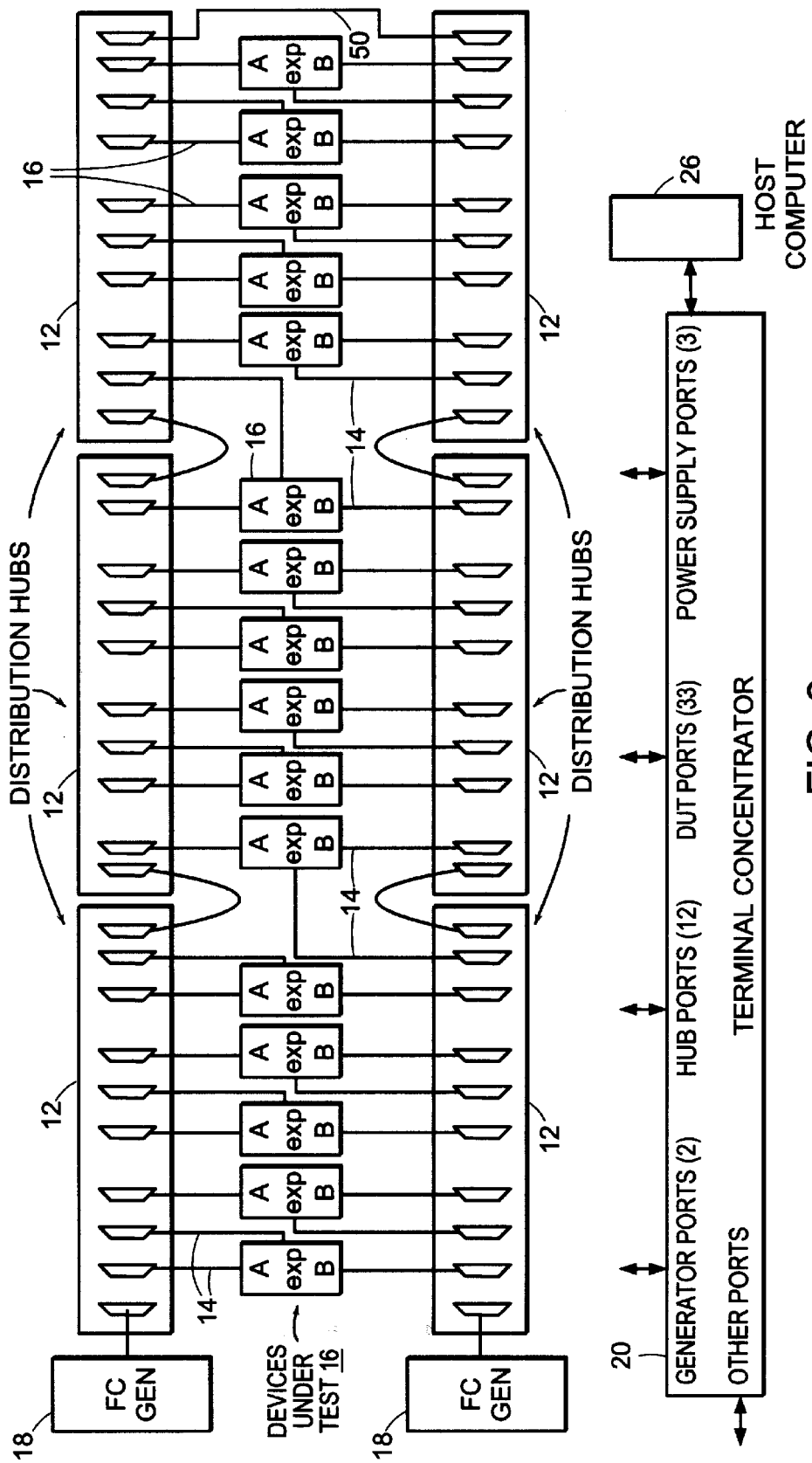
FIG. 2 is a schematic block diagram of a fibre channel test system embodiment of the present invention.

Referring now to FIG. 2, a test system will be described with specific applicability to fibre channel devices. For this embodiment, the distribution hubs 12 preferably have the capability of detecting, reporting and eliminating errors in fibre channel protocol signals propagating through the hubs. A currently preferred distribution hub for performing this function is the Emulex LH5000 Fibre Channel Distribution Hub made and sold by Emulex Corporation of Costa Mesa, Calif. Faults detected by the distribution hub 12 are reported back to the host computer 26 through the terminal concentrator connection. The distribution hubs eliminate errors in the fibre channel test signal by preventing such faulty signals from propagating further on the test path. Thus, testing may continue through the test path. FIG. 2 shows 6 10-port hubs configured for testing 16 devices. Since the test system makes use of the fault detection by the distribution hubs 12 rather than detection by initiators and targets and since the distribution hubs eliminate faulty fibre channel test signals so that testing can continue through the test system, the test system is extremely suitable for mass testing and can be easily expanded by adding distribution hubs.

The test signal generator 18 of the fibre channel embodiment generates fibre channel protocol signals. Fibre channel has an 8B/10B protocol. One useful signal used for hardware testing is the repeating pattern 7E7E7E7E which translates from an 8-bit to a stressful 10-bit repeating pattern. The fibre channel generator 18 may be any suitable fibre channel processor. A presently preferred processor is a Denali processor made and sold by Data General Corporation. Since fibre channel devices are often dual ported for operation over any of two redundant loops, testing is facilitated by having two test signal generators 18.

The fibre channel protocol test signals do not target any of the devices under test 16. Rather, the test signals are loop back signals addressed to the originating test signal generator. The devices under test 16 are tested in a passive mode so that the test signals merely pass through the device circuitry. The devices under test therefore are not reading the incoming signals for detecting errors. The system relies on the distribution hubs 12 to detect errors in the test signals caused by circuitry in the tested devices.

For clarity of illustration, the connections of the terminal concentrator 20 are not shown in FIG. 2. The terminal concentrator is connected to each device under test 16, to each distribution hub 12, to each test signal generator 18 and to all power supplies 22. The devices under test 16 are dual-ported fibre channel processor boards. The devices shown in FIG. 2 further include an expansion port. The boards are shown in greater detail in FIG. 3.

Figure 3:
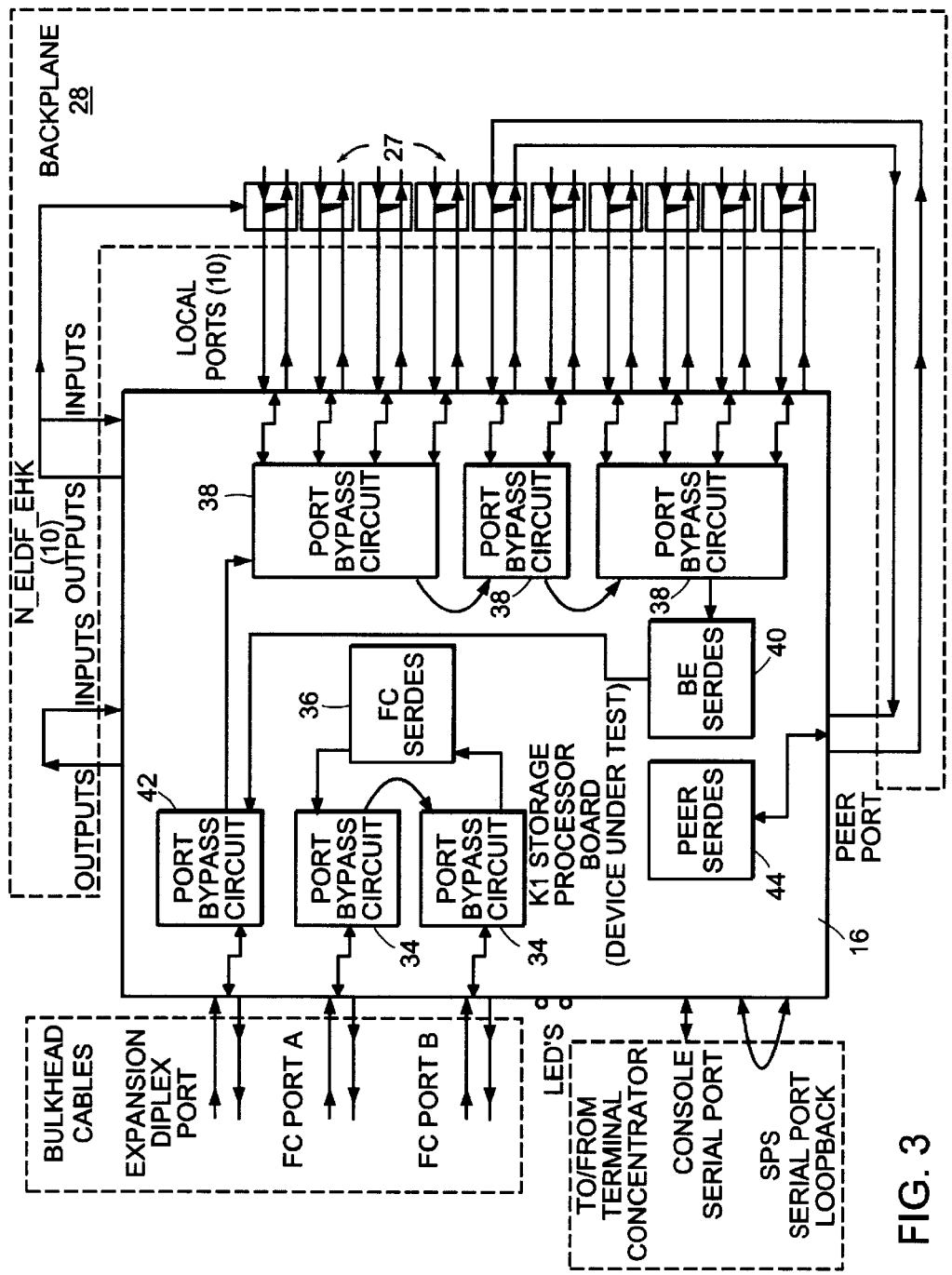
FIG. 3 is a schematic block diagram of a device under test and its connections to the test system of FIG. 2.

The arrangement of a device under test 16 will form the basis for various configurations of test paths through the device components. The device 16 of FIG. 3 is a Data General K1 storage processor board. Ports A and B of the device 16 are each connected to port bypass circuits 34. The two port bypass circuits permit the storage processor to operate on either of two redundant fibre channel loops and to failover from one to the other. A front end serializer/deserializer 36 is connected to each of the port bypass circuits for performing the 8B/10B conversion and making the converted signal available to the processor on board.

The back end circuitry of the storage processor board 16 in FIG. 3 includes a series of port bypass circuits for making a connection with each of 10 local ports. When used in a storage array system, the 10 ports are used for making direct connection to each of the disk drives. The K1 storage processor is designed for connection with up to 10 local disk drives. The back end serializer/deserializer 40 handles the fibre channel 8B/10B protocol. An additional port bypass circuit 42 interfaces with the expansion port of the storage processor board. A peer serializer/deserializer is connected to a peer port. This communication link provides the board with a direct connection to a storage array system with a second storage processor board. A storage array system is built with two storage processor boards so that should one fail, the other can take over. The peer communication is used to provide a safe failover in such a situation. During testing, the peer port is connected to the test loop via one of the local ports. Port 4 was selected based solely on its interconnection proximity to the peer port.

The test system for the K1 storage processor board includes a backplane 28 for connection to the board's back end. The backplane 28 connects to each device under test in FIGS. 1 and 2. The processor board includes outputs which it uses for driving signals from the board and inputs which is used to receive signals for reading. The backplane connects the outputs to the inputs. The output driving circuitry and input receiving circuitry can be tested by causing a signal pattern to be written out through an output. The board should be able to properly read the signal at the input to pass the test. The outputs are controlled by the host computer accessing control registers in the devices under test via the terminal concentrator. The loopback switches on the backplane are also controlled by a set of these registers. When the device under test is operating as a storage processor, this set of registers enable and disable the disk drives that connect to the local ports.

A connection is also shown in FIG. 3 between the device under test 16 and the terminal concentrator 20. The host computer 26 communicates with the devices under test through an RS232 serial port via the terminal concentrator 20. Also, the K1 storage processor board has an RS232 serial connection for making connection to a standby power source. The processor in operation uses the connection to monitor the state of the battery and a standby power in general. For the diagnostic testing, the input and output are connected to form an (Standby Power Supply) SPS serial loopback. A signal pattern is generated at the output and the test makes sure it can be read at the input.

Figure 4:
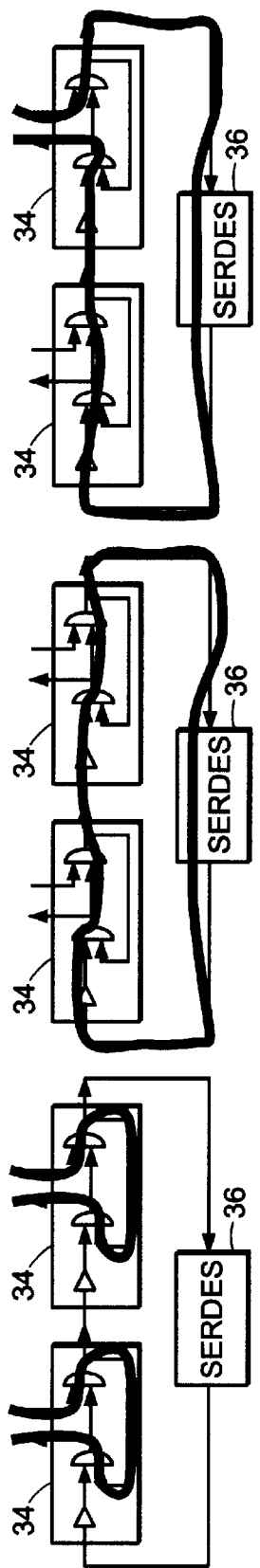
FIGS. 4A–E are schematic block diagrams of available test loops for the front end of a device under test of the type shown in FIG. 3.
Figure 4:
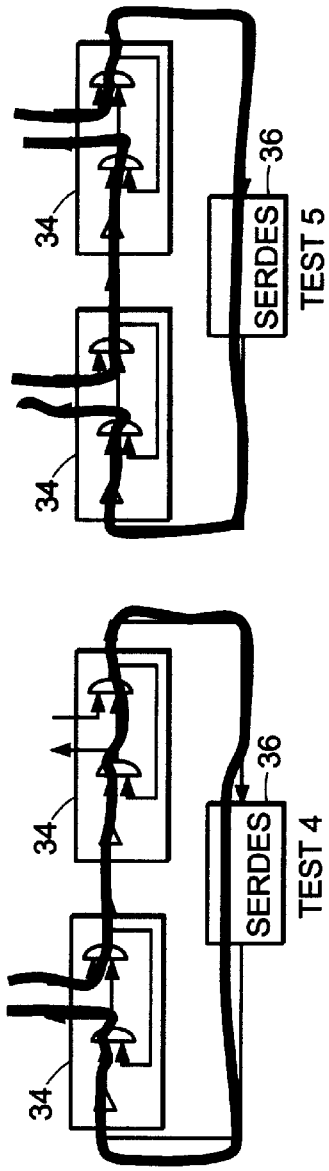

The test system provides significant benefits for the mass testing of fibre channel boards. FIGS. 4A–E show a variety of switch configurations for the front end circuitry to be tested. A variety of tests may be run so that errors on a board can be more accurately pinpointed to particular circuitry. In FIG. 4A, both ports A and B are in a loopback configuration. In FIG. 4B, both ports are in the bypass state. This configuration is used by the board itself during its self-diagnostic run during power up. FIGS. 4C and 4D show one port enabled and the other port bypassed. FIG. 4E shows both ports enabled. Currently preferred testing procedures making use of test system 10 relies primarily on the configurations of FIGS. 4C, D, and E.

Figure 5:
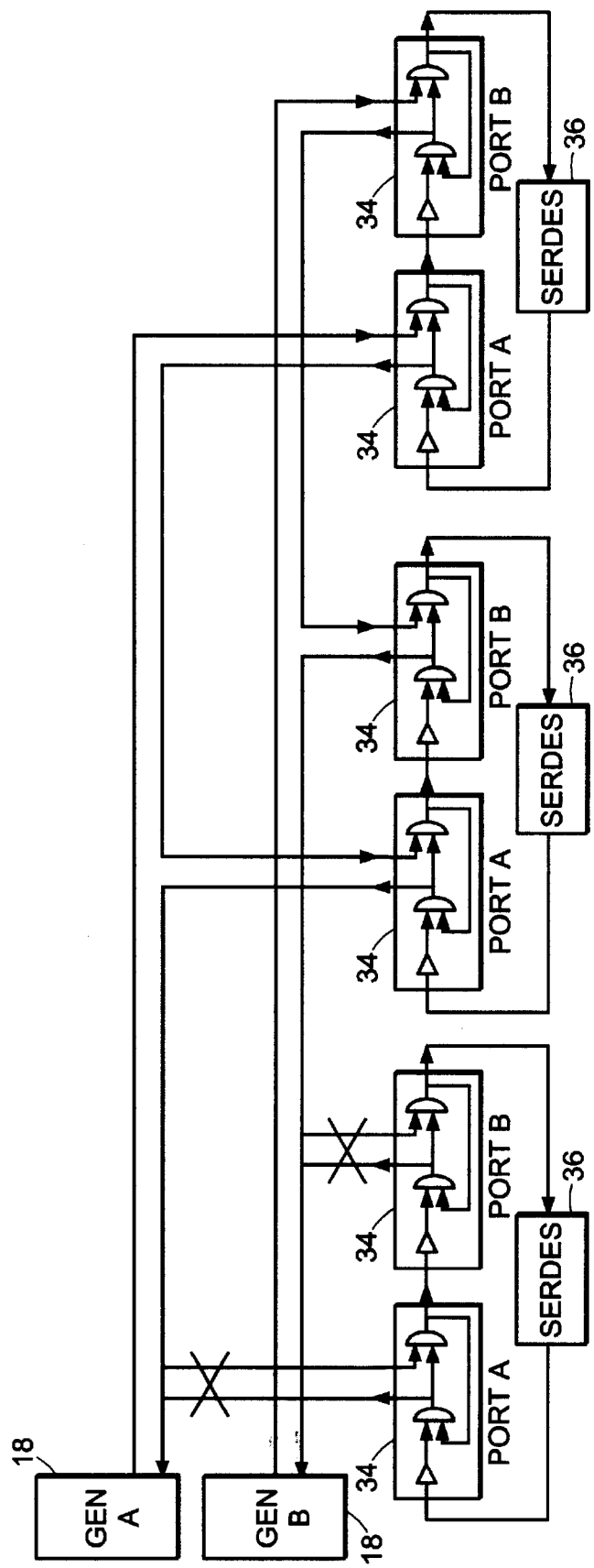
FIG. 5 is a block diagram of a testing arrangement using the configuration of FIG. 4E.

The test system 10 makes possible a variety of testing configurations. In FIG. 5, a test on an even number of processor boards configured in the FIG. 4E configuration makes use of the test signal generators on each of the A-loop and the B-loop. The A signal travels through different portions of each of the port bypass circuits. Likewise, the B signal from the second test signal generator travels through the remaining portions of the port bypass circuits. Errors in the signal along the path are detected by the distribution hubs which are connected between each device under test and between the test signal generators and the devices under test, but are not shown in FIG. 5. The errors are reported to the host 26 through the command path via the terminal concentrator. The devices under test are in passive mode and are therefore not detecting errors. The test signal generator may also detect and report errors in the test signal which loops back to the generator. This test configuration only works for an even number of boards. For an odd number of boards, this configuration ends up with the signal from the A generator swapping loops and returning to the B generator.

Figure 6:
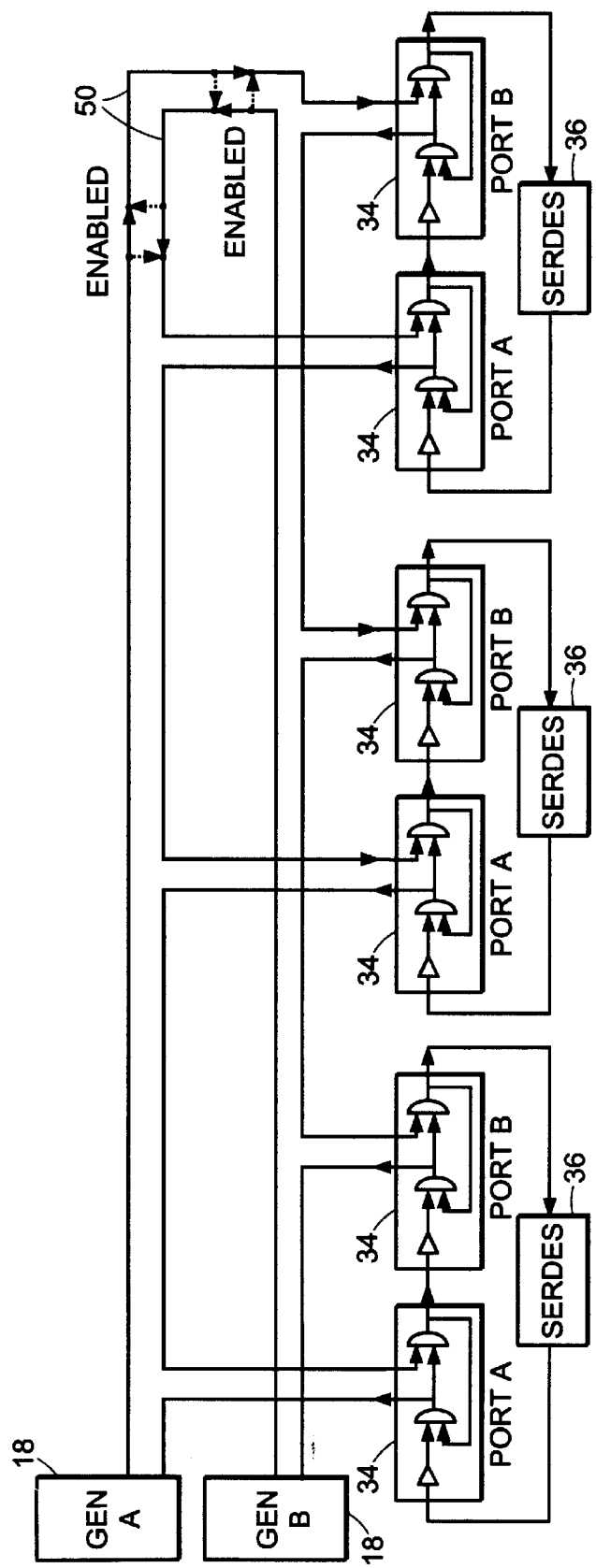
FIG. 6 is a block diagram of an alternate testing arrangement using the configuration of FIG. 4E.

Rather than leave a board out to get an even number, an embodiment of the test system is given the capability of enabling a fibre channel connection between the last A and last B distribution hubs. This crossover connection 50 is shown in FIGS. 2 and 6. By connecting the A and B loops at the end through the distribution hub crossover, the test signal from A is returned to generator A and likewise for the second test signal generator. By enabling or disabling the distribution hub crossover, this test may be run on an even or odd number of processor boards and none of the boards need to be left out.

Figure 7:
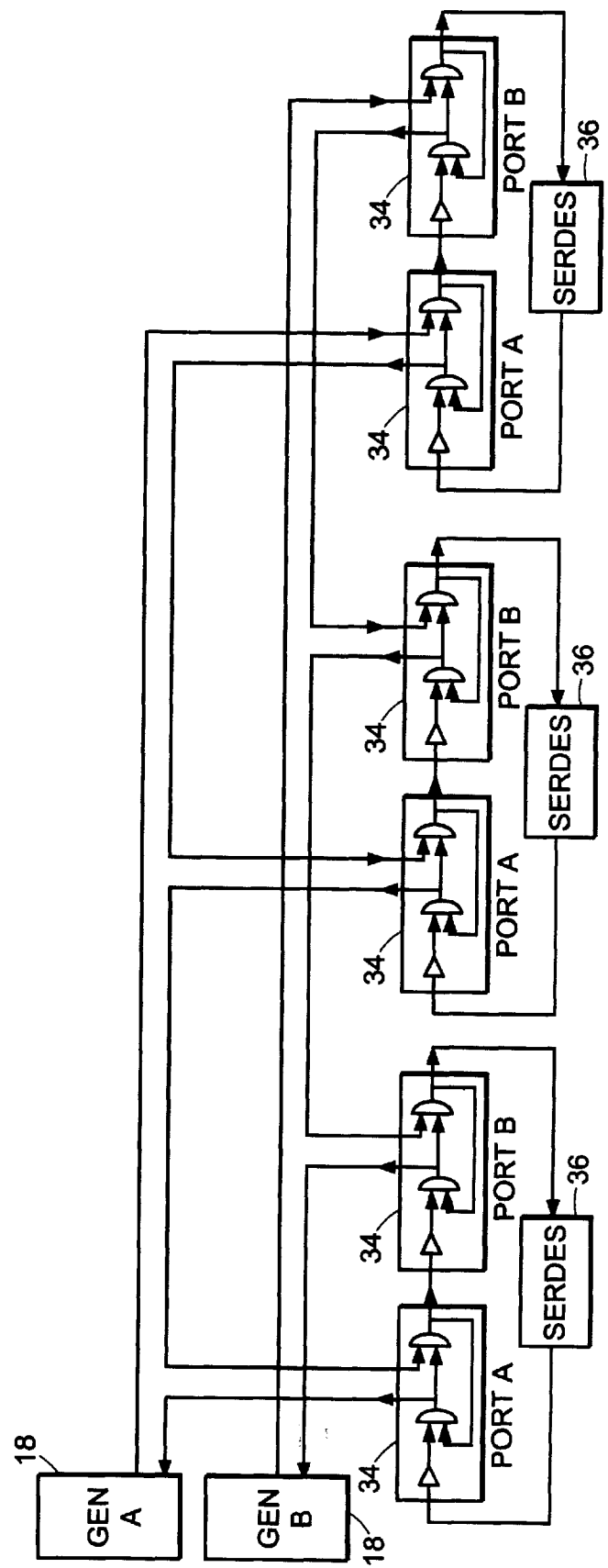
FIG. 7 is a block diagram of a testing arrangement using the configuration of FIG. 4C.

Using the test configuration of FIG. 4C, any number of boards can be tested by a single test signal generator. FIG. 7 shows the setup with generator B supplying and receiving the test signals through all of the processor boards. Errors are advantageously detected by the distribution hubs which encompass the test paths between the test signal generator and the processor boards. Using test configuration 4D, the other test signal generator can be used to test all of the boards. Testing the boards involves sending the test signal through the configured path and detecting errors in the signal using the distribution hubs and the test signal generator. The distribution hubs can be used to eliminate errors so that testing can continue despite detection of an error. This system is advantageously expandable by adding additional distribution hubs to provide connections to additional processor boards for mass testing.

Tests of the back end electronics are performed through the expansion port. The expansion port of each processor board is connected to one of the A or B fibre loops in the test system 10 as shown in FIG. 2. A number of different loopback test scenarios are run. One such test enables the devices under test onto the test loop by opening (non-bypassed) the expansion port bypass circuit 42 on the device under test. All the local port bypass circuits 38 on the device under test are closed (bypassed). The signal from the distribution hub is expected to enter the expansion port, loop through all the bypassed local ports and exit back to the distribution hub. During this test, the backplane ports 17 are opened (non-bypassed) so that the signal will not circumvent a defective (stuck opened) local port. In the embodiment of FIG. 3, the peer port is tested through local port 4. During port 4 testing, the peer port is held in a reset position. After testing port 4, the back plane port bypass circuit should be reopened resulting in a failing loop. Peer port is then taken out of reset and initialized in the offline state. It the peer port is functional, then the loop should now pass.

In another test scenario, the devices under test are isolated from the main loop by closing (bypassing) the expansion bypass circuit 42. The devices under test 16 are instructed by the host computer to generate their own pattern that is cycled through the local port bypass circuits 38. One at a time, a local port bypass circuit will be opened causing an intentional failure of the internal loop. The associated backplane port is then closed (bypassed) and the loop should again be functional. The internal operation of this test is masked from the host computer 26, and only the final status is returned.

The test system 10 provides extraordinary flexibility in testing a large number of processor boards. Using the distribution hubs 12 to detect errors overcomes the difficulty with fibre channel testing created by the initiator-target error reporting scheme. The system thus benefits when using a test signal that fails to target any of the devices under test, but instead loops back to the test signal generator. The devices are advantageously tested in passive mode so that no additional test programming is required in the devices under test to conduct these tests. Distribution hubs further serve the function of eliminating errors as they are detected. Thus, the occurrence of an error in a test loop does not disable the test and prevent testing of the remaining boards.

Of course, it should be understood that various changes and modifications to the preferred embodiment described above will be apparent to those skilled in the art. For example, the test system and methods may be advantageously used with other communication protocols such as token ring or Ethernet. The actual testing configurations that are made for a given device under test will vary according to the device. The number of distribution hubs and test signal generators will also vary with the desired testing configuration suitable for a particular device. These and other changes can be made without departing from the spirit and scope of the invention and without diminishing its attendant advantages. It is therefore intended that such changes and modifications be covered by the following claims.

We claim:

1. A test system comprising:
   at least one distribution hub, each having a plurality of ports for connecting to devices under test;
   a test signal generator connected in series with said at least one distribution hub; and
   a host for creating a test path by setting switches in said at least one distribution hub and in the devices under test and causing said test signal generator to send test signals along the test path.

2. The test system of claim 1 further comprising a terminal concentrator connected to said host for providing a communication link to each of said at least one distribution hub and each device to be tested in connection with said at least one distribution hub, the communication link for use in setting switches.

3. The test system of claim 1 further comprising a temperature controlled chamber for housing the devices under test.

4. The test system of claim 1 further comprising a power supply in connection with the devices under test and having a variable output voltage controlled by said host.

5. The test system of claim 1 wherein the test path is a loop and wherein the test system further comprises a second test signal generator and a second at least one distribution hub in series connection with said second test signal generator to permit formation of a second test loop.

6. The test system of claim 5 further comprising a crossover connection between the first test loop and the second test loop from a port of said first at least one distribution hubs to a port of said second at least one distribution hubs.

7. The test system of claim 1 wherein said at least one distribution hub detects and reports errors in the test signals to help locate a faulty device.

8. The test system of claim 1 wherein said at least one distribution hub detects and eliminates errors in the test signals so that testing can proceed through the test path despite an error.

9. The test system of claim 8 wherein the test signals produced by said test signal generator are fibre channel protocol signals.

10. The test system of claim 1 wherein the test path is a loop and the test signals produced by said test signal generator are fibre channel protocol signals addressed for looping back to said test signal generator.

11. A fibre channel test system comprising:
    at least one distribution hub, each having a plurality of ports for connecting to devices under test;
    a host for creating a test path by setting switches in said at least one distribution hub and in the devices under test and causing fibre channel protocol signals which do not target a device under test to be sent along the test path; and
    wherein said at least one distribution hub detects and reports errors in the fibre channel protocol signals to help locate a faulty device.

12. The fibre channel test system of claim 11 further comprising a test signal generator connected in series with said at least one distribution hub to produce the fibre channel protocol signals in response to said host.

13. The fibre channel test system of claim 12 wherein the test path is a loop and wherein the test system further comprises a second test signal generator and a second at least one distribution hub in series connection with said second test signal generator to permit formation of a second test loop.

14. The fibre channel test system of claim 13 further comprising a crossover connection between the first test loop and the second test loop from a port of said first at least one distribution hub to a port of said second at least one distribution hub.

15. The fibre channel test system of claim 11 further comprising a terminal concentrator connected to said host for providing a communication link separate from the test path to each of said at least one distribution hubs and each device to be tested in connection with said at least one distribution hub, the communication link for use in setting switches.

16. The fibre channel test system of claim 15 further comprising a power supply in connection with the devices under test and having a variable output voltage controlled by said host through said terminal concentrator.

17. The fibre channel test system of claim 11 wherein said at least one distribution hub detects and eliminates errors in the fibre channel protocol signals so that testing can proceed through the test path despite an error.

18. A test system comprising:
  at least one distribution hub, each having a plurality of ports for connecting to devices under test;
  a multi-terminal connector providing a command path to each of said at least one distribution hub and each of the devices under test;
  a host connected to the command path of said multi-terminal connector for setting switches in said at least one distribution hub and in the devices under test, the switches thereby creating a test path independent of the command path and said host including means for causing test signals to be sent along the test path.

19. The test system of claim 18 further comprising a test signal generator in communication with said host through said multi-terminal connector and connected to the test path to produce the test signals in response to said host.

20. The test system of claim 19 wherein the test path is a loop and the test signals produced by said test signal generator are fibre channel protocol signals addressed for looping back to said test signal generator.

21. The test system of claim 18 further comprising a power supply in connection with the devices under test and having a variable output voltage controlled by said host through said multi-terminal connector.

22. The test system of claim 18 further comprising a second at least one distribution hub having a plurality of ports for connection to the devices under test and wherein said multi-terminal connector provides a command path to said second at least one distribution hub for forming a second test loop.

23. The test system of claim 22 further comprising a crossover connection between the first test loop and the second test loop from a port of said first at least one distribution hub to a port of said second at least one distribution hub.

24. The test system of claim 18 wherein said at least one distribution hub detects and eliminates errors in the test signals so that testing can proceed through the test path despite an error.

25. The test system of claim 24 wherein the test signals are fibre channel protocol signals.

26. The test system of claim 18 further comprising a temperature controlled chamber for housing the devices under test.

27. A fibre channel test system comprising:
  a first fibre channel signal generator;
  a second fibre channel signal generator;
  a first at least one distribution hub having a plurality of ports, said first at least one hub being connected in series with said first fiber channel signal generator;
  a second at least one distribution hub having a plurality of ports, said second at least one hub being connected in series with said second fiber channel signal generator and wherein dual ported devices under test are connected to said first at least one distribution hub and to said second at least one distribution hub; and
  a host for creating a first test loop by setting switches in said first at least one distribution hub and in the devices under test and a second test loop by setting switches in said second at least one distribution hub and in the devices under test and causing said first and second fibre channel signal generators to send test signals along their respective test paths.

28. The test system of claim 27 further comprising a crossover connection between the first test loop and the second test loop from a port of said first at least one distribution hub to a port of said second at least one distribution hub.

29. The test system of claim 27 wherein said first and second at least one distribution hubs detect and report errors in the test signals to help locate a faulty device.

30. The test system of claim 27 wherein said first and second at least one distribution hubs detect and eliminate errors in the test signals so that testing can proceed through the test paths despite an error.

31. The test system of claim 27 wherein the test signals produced by said first and second test signal generators are fibre channel protocol signals addressed for looping back.

32. A method of testing a plurality of processor boards comprising:
  connecting the plurality of processor boards to at least one distribution hub;
  communicating with the plurality of processor boards and the at least one distribution hub through a command path to set switches therein to create a test path separate from the command path;
  generating test signals;
  sending the test signals through the at least one distribution hub into one or more of the processor boards along the test path; and
  identifying a processor board that causes an error in said test signals.

33. The method of claim 32 wherein said step of identifying comprises said at least one distribution hub detecting and reporting an error.

34. The method of claim 32 wherein the test signals are fibre channel protocol signals addressed so as to loop back and said step of sending comprises propagating the test signals from a test signal generator through the test path in a loop back to the test signal generator.

35. The method of claim 34 further comprising said at least one distribution hub detecting and eliminating an error in the test signals so that testing may proceed around the test loop.

36. A method of testing a plurality of fibre channel boards comprising:
  connecting the plurality of fibre channel boards to at least one distribution hub;
  setting switches in the plurality of fibre channel boards and in the at least one distribution hub to create a test loop;
  generating fibre channel protocol test signals which do not target any of the fibre channel boards so as to loopback through the test loop;
  sending the test signals through the test loop; and
  detecting in one of the at least one distribution hub an error in the test signals to locate a faulty fibre channel processor board.

37. The method of claim 36 further comprising eliminating in the one distribution hub the error in the test signals so that testing may continue around the test loop.

* * * * *